(12) United States Patent
Döhrmann

(10) Patent No.: US 8,871,066 B2
(45) Date of Patent: Oct. 28, 2014

(54) SAMPLE RECEIVING DEVICE FOR SAMPLE MATERIALS IN ULTRA-HIGH VACUUM CHAMBERS

(75) Inventor: Ralph Döhrmann, Vögelsen (DE)

(73) Assignee: Deutsches Elektronen-Synchrotron DESY, Hamburg (DE)

( * ) Notice: Subject to any disclaimer, the term of this patent is extended or adjusted under 35 U.S.C. 154(b) by 201 days.

(21) Appl. No.: 13/499,889

(22) PCT Filed: Oct. 4, 2010

(86) PCT No.: PCT/EP2010/006052
§ 371 (c)(1),
(2), (4) Date: Jun. 20, 2012

(87) PCT Pub. No.: WO2011/038938
PCT Pub. Date: Apr. 7, 2011

(65) Prior Publication Data
US 2012/0267244 A1 Oct. 25, 2012

(30) Foreign Application Priority Data
Oct. 2, 2009 (DE) .......................... 10 2009 048 170

(51) Int. Cl.
*H01L 21/68* (2006.01)
*H01L 21/687* (2006.01)
*H01J 37/34* (2006.01)

(52) U.S. Cl.
CPC ....... *H01L 21/68792* (2013.01); *H01J 37/3411* (2013.01)
USPC .............. 204/298.15; 279/4.08; 82/1.11

(58) Field of Classification Search
CPC ................................................... H01J 37/3411
See application file for complete search history.

(56) References Cited

U.S. PATENT DOCUMENTS

| 6,213,478 B1* | 4/2001 | Nishikawa ................... 279/4.08 |
| 2002/0144787 A1 | 10/2002 | Yamaguchi |
| 2005/0087046 A1* | 4/2005 | Smith ........................... 82/1.11 |

FOREIGN PATENT DOCUMENTS

| GB | 2305141 A | 4/1997 |
| JP | 2003077992 A | 3/2003 |

* cited by examiner

*Primary Examiner* — Keith Hendricks
*Assistant Examiner* — Timon Wanga
(74) *Attorney, Agent, or Firm* — Hovey Williams LLP

(57) ABSTRACT

The disclosure relates to a sample-receiving device for sample materials in ultra-high vacuum chambers, in particular for sputter coating installations.

6 Claims, 2 Drawing Sheets

SAMPLE RECEIVING DEVICE FOR SAMPLE MATERIALS IN ULTRA-HIGH VACUUM CHAMBERS

RELATED APPLICATION

This is a National Phase Application pursuant to 35 U.S.C. §371 of International Application No. PCT/EP2010/006052, filed Oct. 4, 2010, claiming priority from German Patent Application No. DE 20 2009 048 170.2, filed Oct. 2, 2009, the entire disclosures of both of which are hereby incorporated by reference herein.

BACKGROUND

The present invention relates to a sample-receiving device for sample materials in ultra-high vacuum chambers, in particular for sputter coating installations.

For such applications, use has been made, up until now, of sample holders which have a disk-like sample-bearing body with a planar upper sample-bearing surface. These disks or plates were then inserted into a recess of a mounting part, in order to ensure precisely positioned placement of the sample holder. The contact-pressure force, for this sample-receiving operation, is introduced into the sample holder from above. Once coating has taken place, the sample holder then has to be removed, for which purpose the evacuated state of the ultra-high vacuum chamber has to be disabled, and then a further sample holder has to be inserted into the mounting part, whereupon the chamber has to be evacuated anew before the next sputter operation can follow. In conjunction with the present invention, the aim is to arrange a plurality of sample holders on a turntable in an ultra-high vacuum chamber, it being possible for a robot arm to remove each sample holder from the turntable and replace it by a new sample holder, which is advanced up from a connected supply chamber.

A further aim in respect of such an application is for the sample holders to be pulled against a bearing surface of a mounting part by a predetermined force, in order to allow reproducible heating and cooling of the sample holder by heating or cooling of the mounting part. Furthermore, no components of the clamping device may project beyond the surface of the samples.

SUMMARY

It is therefore an object of the present invention to specify a sample-retaining device by means of which a supplied sample holder can be clamped in an automatable manner on a mounting part and which is suitable for automated use in an ultra-high vacuum chamber.

This object is achieved by a sample-retaining device having the features described below.

The sample-retaining device has an interchangeable sample holder which can be clamped in a mounting part. The sample holder comprises a disk-like sample-bearing body with a planar upper sample-bearing surface, onto which are fastened sample materials, which are then coated, for example, by sputtering in a sputter coating installation. The sample holder also has an extension, which projects from that side of the sample-bearing body which is located opposite the sample-bearing surface. By means of this extension, the sample holder can be introduced into a centering opening of the mounting part. The mounting part has, in its interior, a through-passage opening, which adjoins the centering opening. A tie rod can be introduced into this through-passage opening, from that side of the mounting part which is located opposite the centering opening. The tie rod carries, at its end which is to be introduced, at least two clamping bodies, which are retained in a movable manner relative to the tie rod such that they can execute a movement transversely to the longitudinal axis of the through-passage opening and of the tie rod. The mounting part contains a guide curve, which is fixed relative to the mounting part, in order to guide the clamping bodies when the tie rod is moved in the direction of the longitudinal axis of the through-passage opening. The guide curve here is formed such that the clamping bodies, in a first position in the longitudinal direction of the through-passage opening, are pressed onto the extension, in engagement behind radial engagement protrusions. This engagement of the clamping bodies behind the radial engagement protrusions on the extension, i.e. on that side of the engagement protrusions which is directed away from the tie rod, gives rise to force-fitting and form-fitting engagement of the clamping bodies on the extension of the sample holder, and therefore the tie rod, by pulling downward on the sample holder, can subject the sample holder to a tensile force in the direction of the centering opening and can thus pull the sample holder onto the mounting part by a predetermined, tensile force. The guide curve, furthermore, is formed such that the clamping bodies, upon movement into a second position in the longitudinal direction of the through-passage opening, wherein the second position is closer to the centering opening than the first position, are displaced in a direction transverse to the longitudinal axis of the through-passage opening to such an extent that they are located outside the through-passage route of the radial engagement protrusions, and therefore the radial engagement protrusions can pass by the clamping bodies when the extension of the sample holder is pulled out of the through-passage opening and out of the centering opening.

This construction makes it possible, for example, for a single linear movement of the tie rod, that is to say a displacement in the downward direction, to ensure that a newly inserted sample holder is clamped in on the mounting part. It is precisely in the case of applications in an ultra-high vacuum that the number of parts and the complexity of the movement thereof have to be minimal, this requirement being met in the present case since all that is required is for a single part to execute a linear movement. Furthermore, exerting a controllable tensile force via a spring device, which acts on the tie rod, makes it possible to predetermine the tensile force to which the sample holder is subjected and thus the force by which the sample holder is pulled onto the mounting part. That surface area of the sample-bearing body which surrounds the extension then butts with surface contact against a surface of the mounting part. The mounting part may be connected to a temperature-controlled part, as a result of which reproducible temperature control of the sample holder is possible since, with a predetermined contact surface area and predetermined contact pressure on one another, the mechanical contact can be made in a reproducible manner and thus reproducible heat-exchanging conditions are achieved.

In an advantageous embodiment, the tie rod has fitted on it two elongate retaining elements, which, at their end which is remote from the tie rod, each carry a clamping cylinder as clamping body. The retaining elements here are designed such that they can flex elastically transversely to their longitudinal extent, this making it possible for the clamping bodies to move as they are guided on the guide curve. The retaining elements may be designed, for example, in the form of elongate wires. In this exemplary embodiment, the guide curve is designed such that the guide curve presses the clamping cylinders, in the first position thereof, onto an undercut region of the extension of the sample holder, and therefore the tie rod is connected in a force-fitting manner to the sample holder. From this position, the guide curve widens upward and has a curve component which moves the clamping cylinders outward away from the longitudinal axis of the through-passage opening as they move through the through-passage opening in the direction of the centering opening. Upon movement of the clamping cylinders into a second position, these cylinders are then displaced radially outward to such an extent that the engagement protrusions on the extension of the sample holder can pass by them when the sample holder is pulled out of the through-passage opening and centering opening.

As an alternative, the clamping bodies may also be formed by three or more balls which are carried on elongate retaining elements of the tie rod. The clamping bodies here should be arranged such that in the clamping-in position, with contact pressure against the extension of the sample holder, the forces to which they subject the extension cancel out. This requirement is met, for example, in the case of two clamping bodies if the latter are arranged precisely opposite one another and the guide curve is formed correspondingly symmetrically, and therefore the two clamping bodies act precisely counter to one another. In the case of more than two clamping bodies, these bodies would have to be distributed along a circle such that the overall force to which they subject the extension is zero. This ensures that the operation of the sample holder being clamped in does not result in the extension being subjected to a net force transversely to its longitudinal direction, which could result, overall, in the sample holder being displaced in the centering opening.

The movement of the clamping bodies from the position in which they clamp the sample holder in into a position in which they release the same for removal purposes need not be a movement which is directed radially outward from the longitudinal axis. It is basically also conceivable to have embodiments in which the clamping bodies act behind a radial inwardly directed protrusion in a hollow body of the extension, wherein the position in which the clamping bodies lock the sample holder is then located further outward in the radial direction, in relation to the longitudinal axis, than the position in which the clamping bodies release the sample holder, and in which the clamping bodies can allow the protrusions to pass by, i.e. the protrusions are located within a lower opening of the hollow body when the latter is pulled past them in the upward direction.

BRIEF DESCRIPTION OF THE DRAWING FIGURES

The invention will be described hereinbelow with reference to an exemplary embodiment in the drawings, in which.

DETAILED DESCRIPTION OF THE PREFERRED EMBODIMENTS

Figure 1:
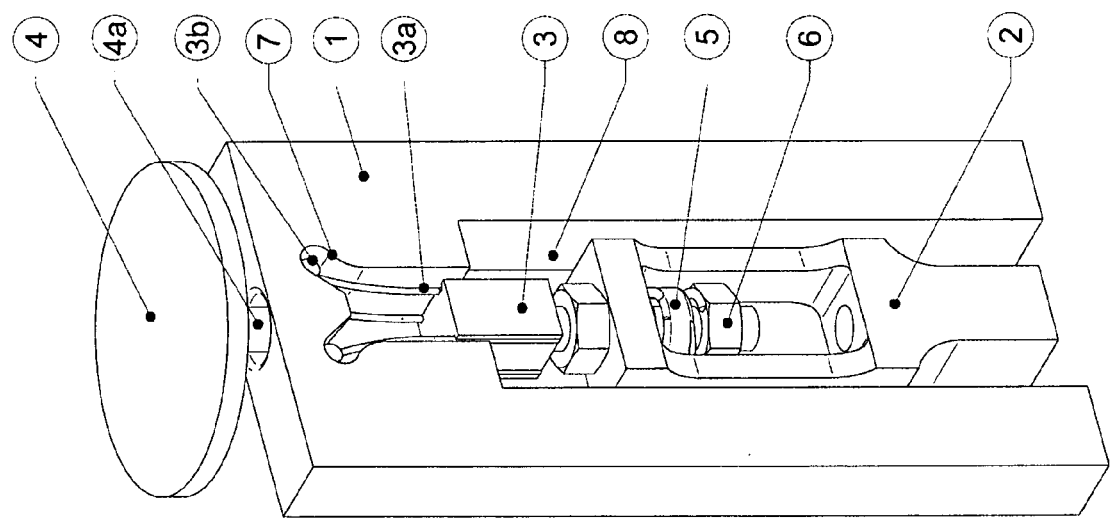
FIG. 1 shows a schematic view, in perspective, of the embodiment.

The figures show a fixed mounting part 1, which is provided with a centering opening at the top. The centering opening merges, in a downward direction, into a through-passage opening 8. A sample holder 4 can be introduced into the centering opening, and removed therefrom, by way of its extension 4a.

A tie rod 3 extends some way into the centering opening and the through-passage opening 8. The tie rod 3 carries, at its upper end, two clamping bodies 3b, which, in this exemplary embodiment, are of pin-like or cylindrical form. The clamping bodies 3b are retained above the upper end of the tie rod 3 by elastic retaining elements 3a, e.g. thin metal wires. Two metal wires can be used, for each clamping body 3b, as carriers, which at one end are each connected to one end of the clamping-body pin and at the opposite end are connected to the tie rod. This arrangement means that the clamping bodies 3b, as a result of elastic deformation of the retaining elements 3a, can be moved laterally in relation to the longitudinal axis of the tie rod and centering opening.

Figure 3:
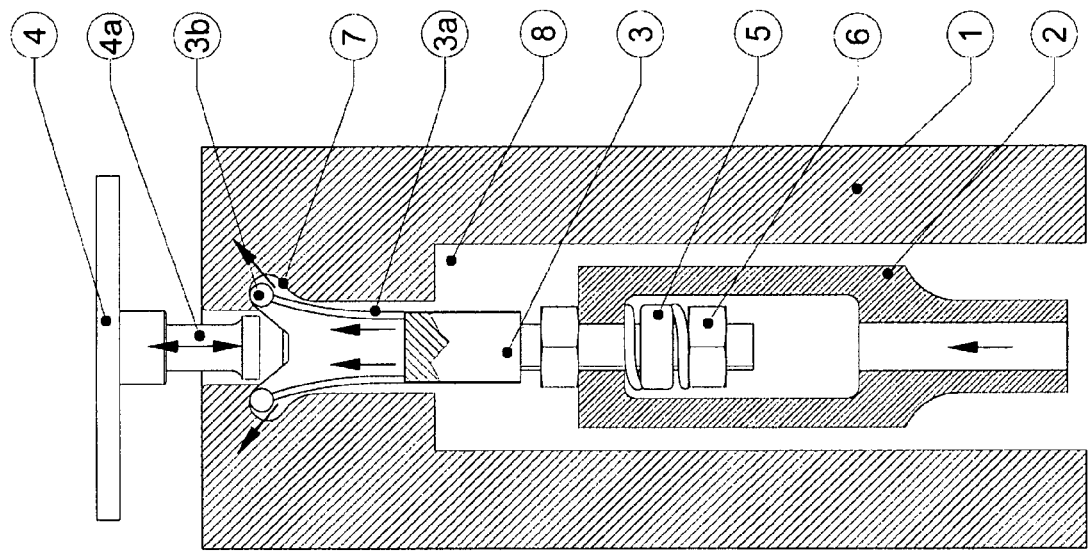

In order to obtain a specific lateral movement of the clamping bodies 3b in reaction to a movement of the tie rod 3 in the longitudinal direction, guide curves 7 are formed in the centering opening. These guide curves 7 are formed such that a linear movement of the tie rod 3 in the longitudinal direction of the through-passage opening 8 and centering opening is accompanied by a lateral movement component of the clamping bodies 3b in a direction perpendicular to the aforementioned linear movement. The clamping bodies 3b are guided positively here such that, in a first position of the tie rod 3, they are pressed into contact pressure against the extension 4a of the sample holder 4, behind radial protrusions on the extension, and therefore the tie rod 3, via the clamping bodies 3b, can subject the extension 4a, and thus the sample holder 4, to a tensile force in the direction of the centering opening. This position is illustrated in FIG. 3, in which the clamping bodies 3b are pressed onto the extension 4a, in engagement behind the radial protrusion at the end of the extension. In this position, the sample holder 4 has been clamped in on the mounting part 1 and is pulled against the mounting part 1 by a predetermined force.

Figure 2:
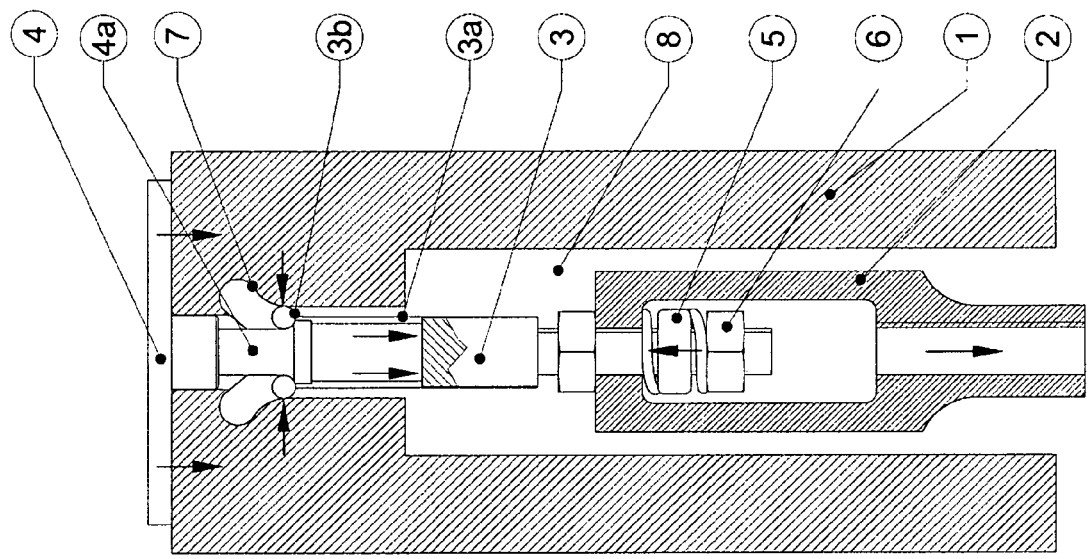
FIGS. 2 and 3 show cross-sectional illustrations of the embodiment in a position in which the sample holder is locked (FIG. 3) and a position in which the sample holder is released (FIG. 2).

In order for it to be possible to remove the sample holder from the mounting part 1, the tie rod 3 is moved linearly, in this case, vertically, upward, as a result of which the clamping bodies 3b are likewise moved upward. The guide curve 7 here is formed such that the linear upward movement of the clamping bodies 3b is associated with a perpendicular movement component in the radially outward direction, and therefore the clamping bodies 3b, finally, are displaced outward to such an extent that the radial protrusions on the extension 4a of the sample holder can pass by the clamping bodies 3b when the sample holder 4 is pulled out of the centering opening in the upward direction by way of its extension 4a. This position is illustrated in FIG. 2. In this position, a sample holder 4 can be removed, for example, by a robot arm, whereupon a new sample holder 4 can be advanced up and inserted into the centering opening of the mounting part 1. This is followed by the tie rod 3 being moved linearly downward in the opposite direction into the position which is illustrated in FIG. 3, whereupon the new sample holder 4 has been clamped in the mounting part 1 and is pressed onto the same by a predetermined force.

In order to adjust the contact-pressure force of the sample holder 4 on the mounting part 1 in the clamped-in position, the tie rod 3 is provided, at the bottom end, with an adjusting nut 6. The lower end of the tie rod 3 is accommodated by a cavity of an actuating rod 2, the tie rod 3 being introduced into the upper end of the latter. Between the opening in the actuating rod 2, through which the tie rod 3 enters into the same, a spring 5 butts against the wall surface surrounding the opening, on the one hand, and the adjusting nut 6 of the tie rod, on the other hand. With a defined end position, into which the actuating rod 2 is moved (FIG. 3) by a drive (not shown), it is thus possible, by predetermining the position of the adjusting nut 6, to adjust the tensile force to which the sample holder 4 is subjected.

The invention claimed is:

1. A sample-receiving device for sample materials in ultra-high vacuum chambers, said sample-receiving device comprising:
   an interchangeable sample holder,
   said sample holder including—
      a disk-like sample-bearing body presenting a planar upper sample-bearing surface, and
      an extension which projects from a surface of the sample-bearing body which is located opposite the sample-bearing surface, wherein the extension includes a radial engagement protrusion;
   a mounting part including a centering opening configured to receive the extension in a centered manner,
   wherein the centering opening merges into a through-passage opening, with the through-passage opening passing through the mounting part and presenting a longitudinal axis;
   a tie rod including an introduced end introduced into the through-passage opening from a side located opposite the centering opening,
   wherein said introduced end retains at least two clamping bodies in a movable manner such that they can execute a movement transversely to the longitudinal axis of the through-passage opening, each clamping body comprising a clamping cylinder; and
   a guide curve which is fixed relative to the mounting part in order to guide the clamping bodies when the tie rod is moved in the direction of the longitudinal axis of the through-passage opening,
   wherein the guide curve is formed such that, in a first position of the tie rod along the longitudinal axis of the through-passage opening, the clamping bodies are pressed onto the extension to engage the engagement protrusion, such that the tie rod is operable to subject the sample holder to a tensile force in the direction of the centering opening, and
   wherein the guide curve is formed such that, in a second position of the tie rod spaced further into the through-passage opening along the longitudinal axis relative to the first position, the clamping bodies are displaced in a direction transverse to the longitudinal axis of the through-passage opening to such an extent that the radial engagement protrusion is operable to pass by the clamping bodies when the extension of the sample holder is shifted out of the through-passage opening and the centering opening.

2. The sample-receiving device as claimed in claim 1,
   wherein at least two elongate retaining elements are fitted on the tie rod to project beyond the introduced end and each carry a respective clamping body.

3. The sample-receiving device as claimed in claim 2,
   wherein each retaining element is formed by one or more metal wires or by thin spring plates.

4. The sample-receiving device as claimed in claim 1,
   said tie rod including a remote end opposite the introduced end,
   wherein the remote end is connected to an actuating rod at a connection,
   wherein a spring is arranged in the connection,
   said spring being configured to bias the tie rod in a direction oriented toward the actuating rod, in order to pull the tie rod into abutment against a surface of the actuating rod,
   wherein the biasing of the spring can be adjusted by means of an adjusting screw.

5. The sample-receiving device as claimed in claim 2,
   wherein the retaining elements are elastically flexible.

6. The sample-receiving device as claimed in claim 2,
   said tie rod including a remote end opposite the introduced end,
   wherein the remote end is connected to an actuating rod at a connection,
   wherein a spring is arranged in the connection,
   said spring being configured to bias the tie rod in a direction oriented toward the actuating rod, in order to pull the tie rod into abutment against a surface of the actuating rod,
   wherein the biasing of the spring can be adjusted by means of an adjusting screw.

\* \* \* \* \*